(12) United States Patent
Nori et al.

(10) Patent No.: US 7,055,341 B2
(45) Date of Patent: Jun. 6, 2006

(54) HIGH EFFICIENCY COOLING SYSTEM AND HEAT ABSORBING UNIT

(75) Inventors: Hitoshi Nori, Kawasaki (JP); Jie Wei, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/452,631

(22) Filed: Jun. 3, 2003

(65) Prior Publication Data

US 2003/0205054 A1     Nov. 6, 2003

Related U.S. Application Data

(63) Continuation of application No. PCT/JP00/08571, filed on Dec. 4, 2000.

(51) Int. Cl.
*F28F 7/00*     (2006.01)

(52) U.S. Cl. ............... 62/259.2; 165/80.4; 361/282

(58) Field of Classification Search ............... 62/259.4, 62/259.2, 64, 304, 376; 165/80.4, 908; 361/282
See application file for complete search history.

(56) References Cited

U.S. PATENT DOCUMENTS

| | | | | |
|---|---|---|---|---|
| 4,392,362 A | * | 7/1983 | Little | 62/51.1 |
| 5,099,311 A | * | 3/1992 | Bonde et al. | 165/80.4 |
| 5,349,831 A | * | 9/1994 | Daikoku et al. | 62/376 |
| 5,406,807 A | * | 4/1995 | Ashiwake et al. | 62/376 |
| 5,579,826 A | * | 12/1996 | Hamilton et al. | 165/254 |
| 5,687,577 A | * | 11/1997 | Ballard et al. | 62/64 |
| 5,768,103 A | * | 6/1998 | Kobrinetz et al. | 361/699 |
| 5,854,092 A | * | 12/1998 | Root et al. | 438/106 |
| 5,966,957 A | * | 10/1999 | Malhammar et al. | 62/259.2 |
| 6,349,760 B1 | * | 2/2002 | Budelman | 165/80.4 |
| 6,550,263 B1 | * | 4/2003 | Patel et al. | 62/259.2 |
| 6,571,569 B1 | * | 6/2003 | Rini et al. | 62/259.2 |
| 6,580,609 B1 | * | 6/2003 | Pautsch | 361/698 |

FOREIGN PATENT DOCUMENTS

| | | |
|---|---|---|
| JP | 61-223469 | 10/1986 |
| JP | 2-162795 | 6/1990 |
| JP | 4-61259 | 2/1992 |
| JP | 5-136305 | 6/1993 |
| JP | 10-185466 | 7/1998 |
| JP | 10-288481 | 10/1998 |

\* cited by examiner

*Primary Examiner*—William E. Tapolcai
(74) *Attorney, Agent, or Firm*—Westerman, Hattori, Daniels & Adrian, L.L.P.

(57) ABSTRACT

The cooling system allows the liquid coolant discharged from the pump to flow into the evaporation chamber. The liquid coolant passes through the atomizer. Minute droplets of the atomized coolant is discharged from the atomizer into the evaporation chamber. The minute droplets serve to form a uniform thin liquid film over the surface of the fin. Heat conducting from a target heat generating object to the fin promotes the evaporation of the liquid coolant over the surface of the fin, for example. The coolant absorbs a large amount of heat from the fin based on the evaporation. The target heat generating object can thus efficiently be cooled.

22 Claims, 7 Drawing Sheets

HIGH EFFICIENCY COOLING SYSTEM AND HEAT ABSORBING UNIT

This application is a continuation of international application PCT/JP00/08571, filed on Dec. 4, 2000.

BACKGROUND OF THE INVENTION

1. Field of the Invention

The present invention relates to a cooling system designed to cool a heat generating object such as a high density device, for example. In particular, the invention relates to a cooling system including: a circulation channel; a pump disposed in the circulation channel so as to force a coolant to circulate through the circulation channel; and a heat absorbing unit disposed in the circulation channel downstream of the pump so as to receive the coolant of the liquid state from the pump.

2. Description of the Prior Art

A refrigeration system may represent a cooling system employing a circulation channel of the closed loop. The refrigeration system employs a so-called compressor for forcing a coolant to circulate through the circulation channel. The compressor is in general capable of discharging the coolant at a high discharge pressure such as 15 atm, for example. Accordingly, a piping structure strong enough to stand against a higher pressure should be employed to establish the circulation channel.

Another well known cooling system allows a liquid coolant to circulate along a circulation channel. A pump can be employed in place of the aforementioned compressor to establish the coercive circulation of the coolant. The pump is in general designed to discharge the coolant at a discharge pressure in a range approximately between 2 atm and 3 atm. A piping structure for establishment of the circulation channel can thus be facilitated as compared with the aforementioned refrigeration system.

However, the latter cooling system is only allowed to utilize a heat transfer to a liquid coolant to cool a target heat generating object. A simple employment of the liquid coolant suffers from a lower cooling efficiency as compared with the aforementioned refrigeration system utilizing the latent heat of the coolant.

SUMMARY OF THE INVENTION

It is accordingly an object of the present invention to provide a cooling system capable of improving a cooling efficiency with a facilitated piping structure.

According to a first aspect of the present invention, there is provided a cooling system comprising: a circulation channel; a pump disposed in the circulation channel so as to force a coolant to circulate along the circulation channel; an evaporation chamber defined within a housing disposed in the circulation channel downstream of the pump, the evaporation chamber allowing the coolant to get vaporized; a fin standing on an inner wall surface of the housing within the evaporation chamber; and an atomizer connecting an outlet to the evaporation chamber.

The cooling system allows the liquid coolant discharged from the pump to flow into the evaporation chamber. The liquid coolant passes through the atomizer. Minute droplets of the atomized coolant is discharged from the atomizer into the evaporation chamber. The minute droplets serve to form a uniform thin liquid film over the surface of the fin. Heat conducting from a target heat generating object to the fin promotes the evaporation of the liquid coolant over the surface of the fin, for example. The coolant absorbs a large amount of heat from the fin based on the evaporation. The target heat generating object can thus efficiently be cooled.

In this case, the atomizer may preferably include a nozzle. The nozzle serves to generate a high speed flow of the liquid coolant in the evaporation chamber. The flow of the liquid coolant simultaneously enjoys a reduction in pressure. The evaporation of the coolant can thus be promoted. The performance of the cooling system can reliably be improved.

According to a second aspect of the present invention, there is provided a cooling system comprising: a circulation channel; a pump disposed in the circulation channel so as to force a coolant to circulate along the circulation channel; a heat absorbing unit disposed in the circulation channel downstream of the pump; coolant passages defined in a housing of the heat absorbing unit and extending in parallel with one another; and an atomizer connecting an outlet to an inlet of a corresponding one of the coolant passages.

The cooling system allows the liquid coolant discharged from the pump to flow into the coolant passages within the housing. The liquid coolant passes through the atomizer. Minute droplets of the atomized coolant is discharged from the atomizer into the coolant passages. The minute droplets serve to form a uniform thin liquid film over the inner surfaces of the coolant passages. Heat conducting from a target heat generating object to the housing promotes the evaporation of the liquid coolant over the inner surfaces of the coolant passages, for example. The coolant absorbs a large amount of heat from the housing based on the evaporation. The target heat generating object can thus efficiently be cooled.

Here, the coolant passage may be a microchannel, for example. If a micro jet is established in the microchannel, such a micro jet serves to keep generating a uniform thin liquid film over the inner surface of the microchannel. An efficient cooling can thus reliably be achieved. The aforementioned nozzle may be utilized to realize the micro jet.

An atmospheric pressure may be maintained upstream of the pump in the aforementioned cooling system. In addition, the discharge pressure of the pump may be set at a relatively low level. The piping structure of the cooling system according to the invention can remarkably be facilitated as compared with a conventional refrigeration system. Moreover, the cooling system of the invention is expected to realize a superior performance with a lower flow rate of the coolant as compared with a cooling system of a conventional type. The volume of the pump can be set smaller.

A condensation chamber may also be defined within the housing. The condensation chamber may be designed to receive the coolant vaporized in the evaporation chamber or coolant passages. The coolant is allowed to get condensed in the condensation chamber. If the condensation chamber co-exists with the evaporation chamber within the housing in this manner, a separate condenser or heat exchanger may be omitted from the circulation channel. The overall structure of the cooling system can be simplified.

According to a third aspect of the present invention, there is provided a heat absorbing unit comprising: a housing; an evaporation chamber defined in the housing; a fin standing on an inner wall surface of the housing within the evaporation chamber; and an atomizer connecting an outlet to the evaporation chamber.

When the coolant is introduced into the evaporation chamber, the heat absorbing unit allows the coolant to pass through the atomizer. Minute droplets of the atomized coolant is discharged from the outlet of the atomizer into the evaporation chamber. The minute droplets serve to form a uniform thin liquid film over the surface of the fin. A target heat generating object can thus efficiently be cooled based on the evaporation of the coolant in the same manner as described above.

According to a fourth aspect of the present invention, there is provided a heat absorbing unit comprising: a housing; coolant passages defined in the housing and extending in parallel with one another; and an atomizer connecting an outlet to an inlet of a corresponding one of the coolant passages.

When the coolant is introduced into the coolant passages, the heat absorbing unit allows the coolant to pass through the atomizer. Minute droplets of the atomized coolant is discharged from the outlet of the atomizer into the coolant passages. The minute droplets serve to form a uniform thin liquid film over the inner surfaces of the coolant passages. A target heat generating object can thus efficiently be cooled based on the evaporation of the coolant in the same manner as described above. The coolant passage may preferably be a microchannel. If a micro jet is established in the microchannel, such a micro jet serves to keep generating a uniform thin liquid film over the inner surface of the microchannel as described above. An efficient cooling can thus reliably be achieved. It is not necessary to match the number of the outlet with the number of the coolant passage.

According to a fifth aspect of the present invention, there is provided a heat absorbing unit comprising: a housing; a high pressure chamber defined in the housing so as to receive a liquid coolant; an evaporation chamber defined in the housing, the evaporation chamber allowing the liquid coolant to get vaporized; a partition wall provided in the housing so as to separate the evaporation chamber from the high pressure chamber; and a nozzle embedded in the partition wall and connecting an outlet to the evaporation chamber.

The heat absorbing unit allows the liquid coolant in the high pressure chamber to vigorously spout out of the outlet of the nozzle. A mixed phase fluid including droplets and gas of the coolant is generated in the evaporation chamber. The mixed phase fluid serves to form a uniform thin liquid film over the inner wall surface of the evaporation chamber. Heat conducting from a target heat generating object to the housing promotes the evaporation of the coolant over the inner wall surface of the evaporation chamber. The coolant absorbs a large amount of heat from the inner wall surface of the evaporation chamber. The target heat generating object is thus efficiently cooled.

According to a sixth aspect of the present invention, there is provided a heat absorbing unit comprising: a housing defining a closed space between a top plate and a bottom plate, the bottom plate contacting a target object; an intermediate plate disposed within the closed space between the top and bottom plates, the intermediate plate connected to an inner wall surface of the housing; an evaporation chamber defined between the intermediate and bottom plates; a fin standing from a wall surface of the housing within the evaporation chamber; an atomizer connecting an outlet to the evaporation chamber; and a condensation chamber defined between the top and intermediate plates, the condensation chamber receiving a gaseous coolant from the evaporation chamber.

When the coolant is introduced into the evaporation chamber, the heat absorbing unit allows the coolant to pass through the atomizer. Minute droplets of the atomized coolant is discharged from the outlet of the atomizer into the evaporation chamber. The minute droplets serve to form a uniform thin liquid film over the surface of the fin. A target heat generating object can thus efficiently be cooled based on the evaporation of the coolant in the same manner as described above. In addition, the condensation chamber co-exists with the evaporation chamber within the housing. A separate condenser or heat exchanger may be omitted downstream of the heat absorbing unit in a circulation channel for the coolant. The heat absorbing unit of the type described above serves to simplify the overall structure of a cooling system employing the same.

According to a seventh aspect of the present invention, there is provided a heat absorbing unit comprising: a housing defining a closed space between a top plate and a bottom plate, the bottom plate contacting a target object; an intermediate plate disposed within the closed space between the top and bottom plates, the intermediate plate connected to an inner wall surface of the housing; coolant passages defined in a space between the intermediate and bottom plates, the coolant passages extending in parallel with one another; an atomizer connecting an outlet to an inlet of a corresponding one of the coolant passage; and a condensation chamber defined between the top and intermediate plates, the condensation chamber receiving a gaseous coolant from the coolant passages.

When the coolant is introduced into the coolant passages, the heat absorbing unit allows the coolant to pass through the atomizer. Minute droplets of the atomized coolant is discharged from the outlet of the atomizer into the coolant passages. The minute droplets serve to form a uniform thin liquid film over the inner surfaces of the coolant passages. A target heat generating object can thus efficiently be cooled based on the evaporation of the coolant in the same manner as described above. In addition, the condensation chamber co-exists with the evaporation chamber within the housing. A separate condenser or heat exchanger may be omitted downstream of the heat absorbing unit in a circulation channel for the coolant. The heat absorbing unit of the type described above serves to simplify the overall structure of a cooling system employing the same.

If a condensation chamber is established within the heat absorbing unit in the aforementioned manner, an air cooling fin may be attached to the outer surface of the top plate. The air cooling fin serves to promote the radiation of heat from the condensation chamber. This allows the heat absorbing unit to discharge a fully condensed coolant or complete liquid coolant. Alternatively, a thermosiphon may be attached to the outer surface of the top plate. The thermosiphon likewise serves to promoted the radiation of heat from the condensation chamber.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
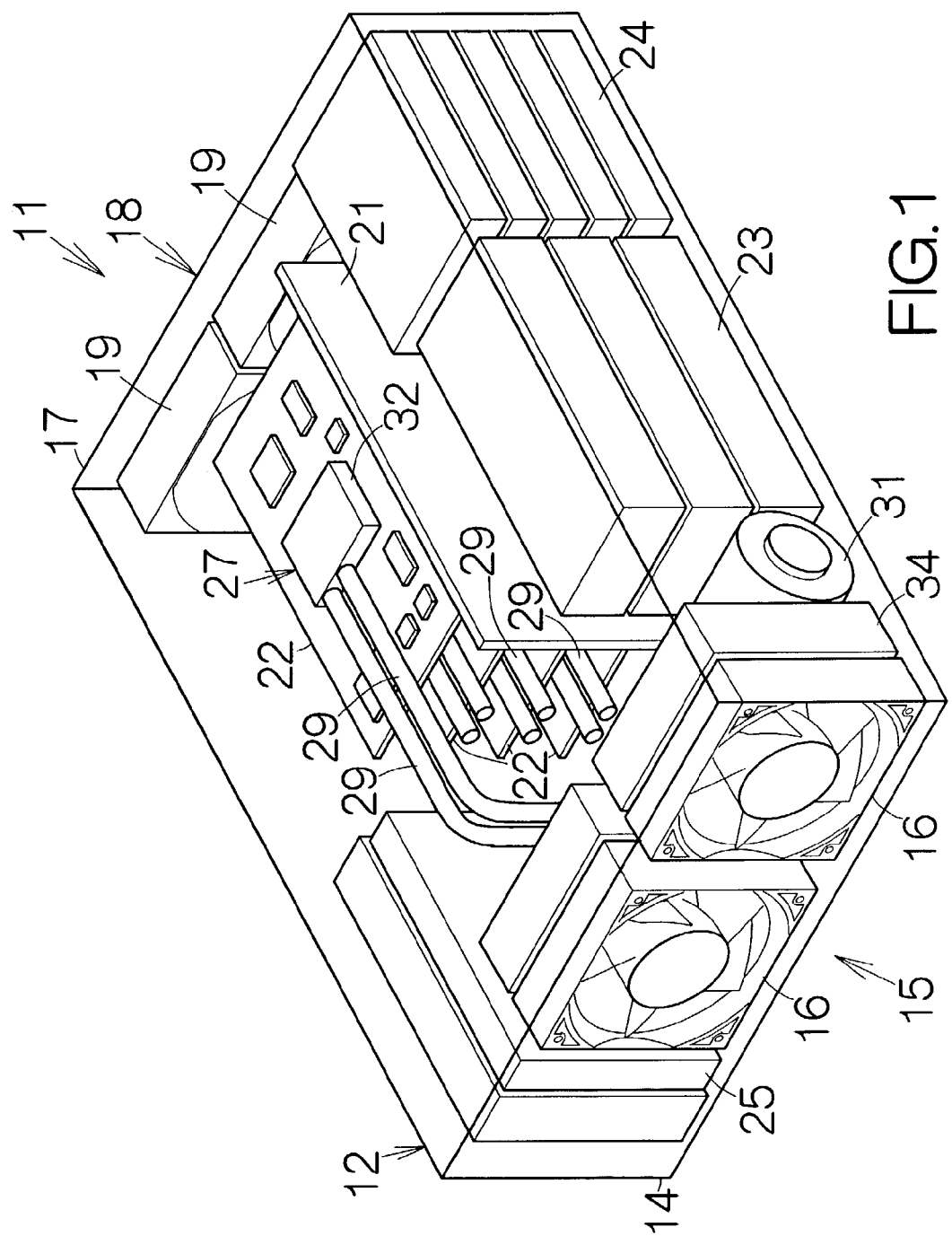
FIG. 1 is a perspective view schematically illustrating an example of a computer apparatus of a rack mount type.

FIG. 1 schematically illustrates an example of a computer apparatus 11 of a so-called rack mount type. The computer apparatus 11 includes an enclosure 12 received on a rack, not shown, for example. The enclosure 12 is designed to define an inner space of a flat parallelepiped. A ventilation unit 15 is embedded within a front wall 14 of the enclosure 12 for sucking the outside air into the inner space of the enclosure 12. The ventilation unit 15 may include a pair of ventilation fans 16 arranged side by side in the horizontal direction, for example. Likewise, a ventilation unit 18 is embedded within a back wall 17 of the enclosure 12 for discharging the inside air out of the inner space. The ventilation unit 18 may include a pair of ventilation fans 19 arranged side by side in the horizontal direction, for example. The ventilation units 15, 18 serve to generate airflow across the inner space from the front side to the backside. The front and back walls 14, 17 may be coupled to the enclosure 12 through hinges, not shown, for opening and closing. The width of the rack may be set at 19 inches as conventionally known, for example.

A printed circuit board or back panel 21 is disposed within the enclosure 12. The back panel 21 stands on the bottom plate of the enclosure 12, for example. Printed circuit boards or motherboards 22 are coupled to the back panel 21. The motherboards 22 stand upright from the surface of the back panel 21 in parallel with one another. Device elements such as a central processing unit (CPU) and a memory unit may be mounted on the surfaces of the motherboards 22.

Power source units 23 as well as input/output (I/O) printed circuit boards 24 are connected to the back panel 21. A wiring is established on the back panel 21 so as to connect the motherboards 22 to the corresponding power source units 23 and input/output printed circuit boards 24. The CPU on the motherboard 22 operates in response to supply of an electric power from the corresponding power source unit 23. The input/output printed circuit board 24 may serve to connect the CPU on the motherboard 22 to external components such as a disk array unit and a switching router, both not shown, likewise mounted within the rack, for example.

A storage device such as a hard disk drive (HDD) 25 may be incorporated within the enclosure 12. As conventionally known, the HDD 25 may hold software programs such as an operating system (OS) and an application software executed in the CPU. A connector, not shown, mounted on the back panel 21, for example, may be employed to establish an electric connection between the HDD 25 and the CPU on the motherboard 22.

A cooling system 27 is incorporated within the enclosure 12. As is apparent from FIG. 2, the cooling system 27 includes a circulation channel 28 of the closed loop, for example. A facilitated piping structure comprising pipes 29, made of vinyl resin, may be employed to establish the circulation channel 28, as shown in FIG. 1, for example.

Referring again to FIG. 2, a pump 31 is incorporated in the circulation channel 28. The pump 31 is designed to force a coolant to circulate along the circulation channel 28. The pump 31 is allowed to discharge the liquid coolant at a discharge pressure in a range between 2 atm and 3 atm, for example. An inert liquid including fluorine, such as FC-72, may be employed as the coolant. The evaporation temperature or boiling point of the coolant is preferably set in a range between 40 degrees Celsius and 60 degrees Celsius, for example. The pump 31 may maintain the pressure of 1 atm at the inlet thereof, for example.

Heat absorbing units 32 according to a first embodiment are incorporated in the circulation channel 28 downstream of the pump 31. The heat absorbing units 32 individually cover over the corresponding CPUs 33 on the motherboards 22. The liquid coolant discharged out of the pump 31 is allowed to get evaporated in the heat absorbing units 32. The evaporation of the coolant serves to cool the CPUs 33. The vaporized coolant, namely, the gaseous coolant is discharged out of the heat absorbing units 32. The liquid coolant may be mixed in the gaseous coolant at the outlets of the heat absorbing units 32. The structure of the heat absorbing unit 32 will be described later in detail.

A condensation unit or heat exchanger 34 and a receiver tank 35 are in this sequence incorporated in the circulation channel 28 downstream of the heat absorbing units 32. The heat exchanger 34 serves to absorb heat from the gaseous coolant discharged from the heat absorbing units 32. The gaseous coolant is allowed to get condensed in the heat exchanger 34. As is apparent from FIG. 1, the air stream from the ventilation fans 16 may be utilized to promote the radiation of heat from the heat exchanger 34. The condensed coolant, namely, the liquid coolant is allowed to flow into the receiver tank 35. The pump 31 sucks the liquid coolant from the receiver tank 35.

Figure 2:
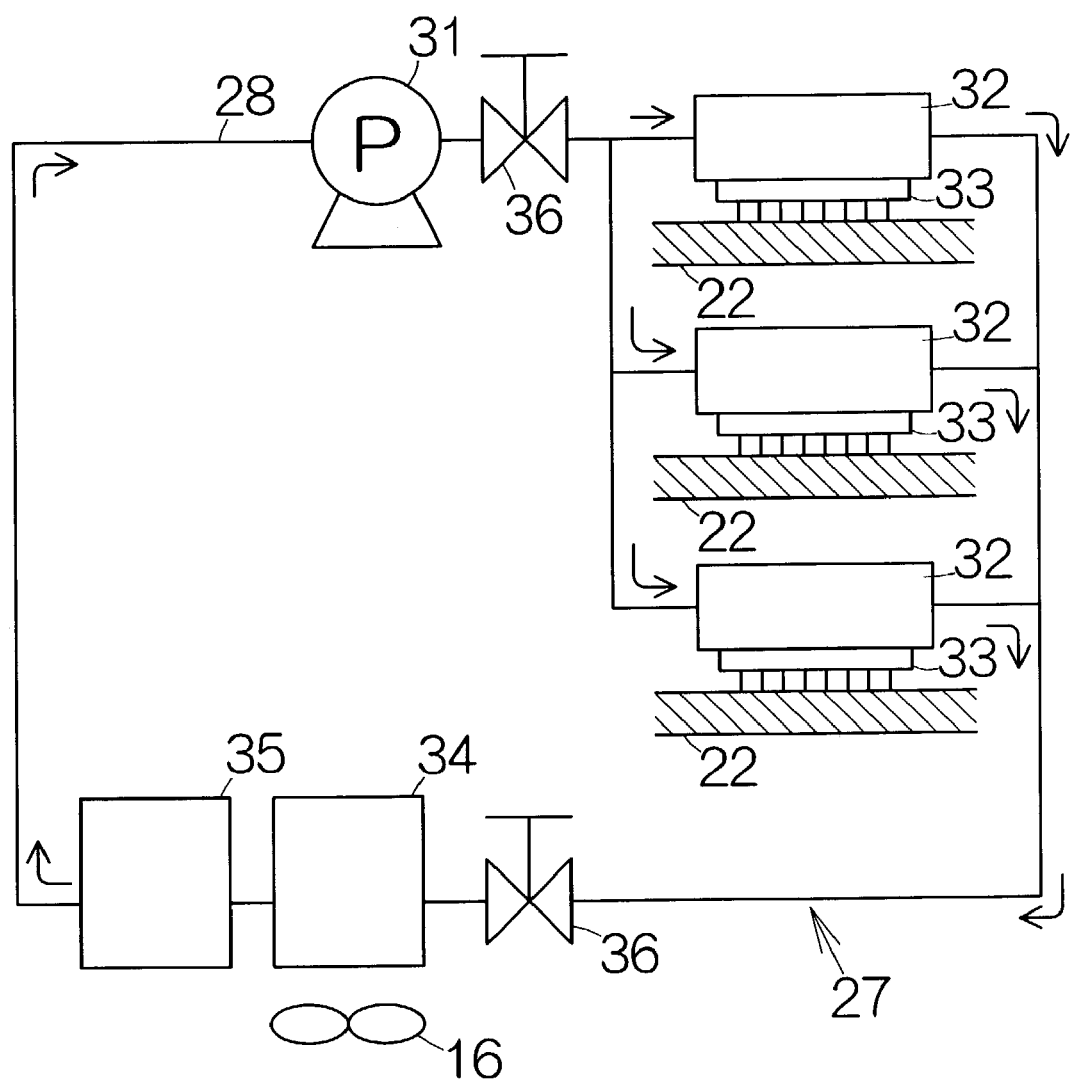
FIG. 2 is a diagram schematically illustrating the overall structure of a cooling system according to the present invention.

As is apparent from FIG. 2, a pair of valves or connectors 36 are incorporated in the circulation channel 28. The valves 36 may be utilized to divide the circulation channel 28 into two parts. The valves 36 serve to establish a facilitated separation of the heat absorbing units 32 from the pump 31, the heat exchanger 34 and the receiver tank 35.

Figure 3A:
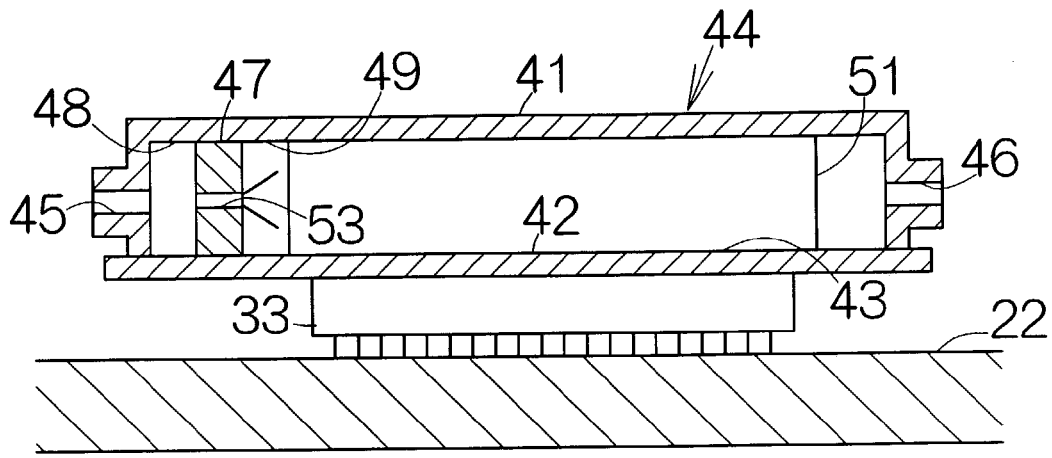
FIG. 3A is a vertical sectional view schematically illustrating the structure of a heat absorbing unit according to a first embodiment in the cooling system.
Figure 3B:
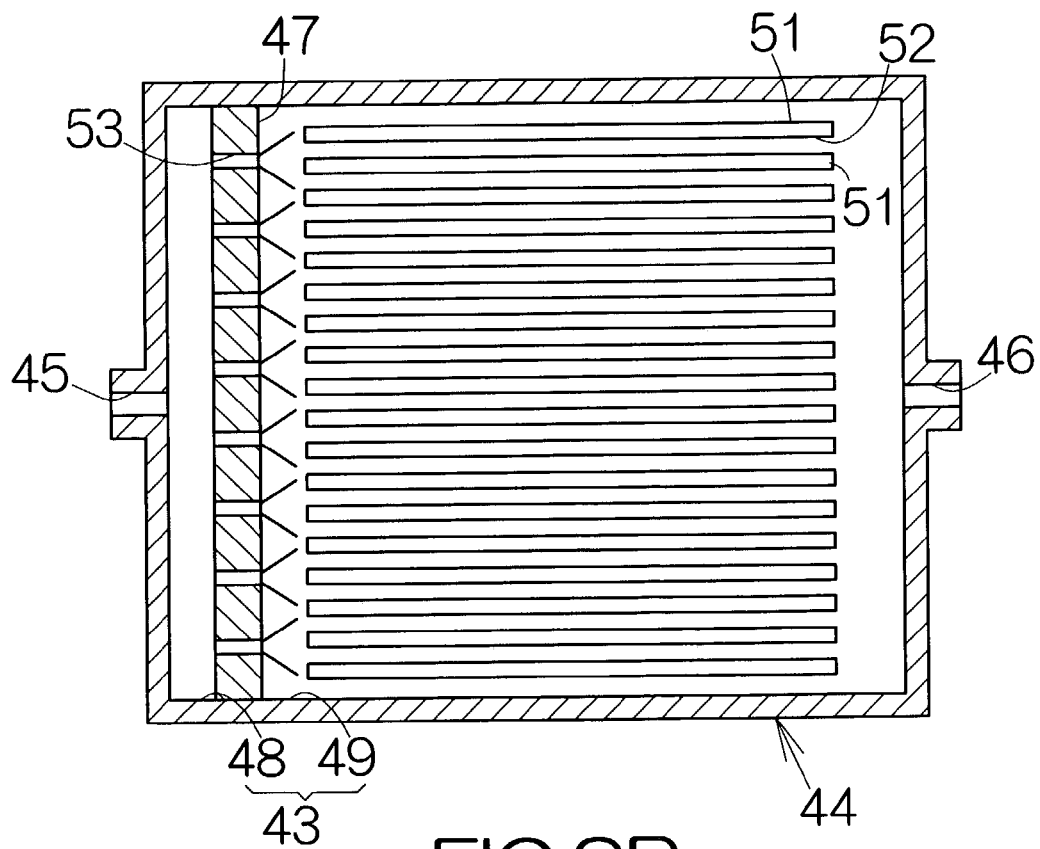
FIG. 3B is a plan view of the bottom plate schematically illustrating the structure of the heat absorbing unit according to the first embodiment.

FIGS. 3A and 3B illustrate the structure of the heat absorbing unit 32 in detail. The heat absorbing unit 32 includes a housing 44 defining a closed space 43 between a top plate 41 and a bottom plate 42. The bottom plate 42 is allowed to contact a target heat generating object, namely, the CPU 33. The closed space 43 of the housing 44 extends from an inlet 45 to an outlet 46. The inlet 45 is connected to the discharge port of the pump 31. The outlet 46 is connected to the heat exchanger 34. The housing 44 may be made of a high heat conductive material such as aluminum, for example.

A partition wall 47 is disposed in the closed space 43 of the housing 44. The partition wall 47 is designed to connect the top and bottom plates 41, 42 to each other. The partition wall 47 serves to define in the closed space 43 an introduction chamber 48 near the inlet 45 and an evaporation chamber 49 near the outlet 46. Specifically, the partition wall 47 serves to isolate the evaporation chamber 49 from the introduction chamber 48. A heat transfer surface of the evaporation chamber 49 is defined on the surface of the bottom plate 42 contacting the CPU 33.

Fins 51 are disposed in the evaporation chamber 49. The fins 51 stand from the wall surface of the housing 44, namely, from the upper surface of the bottom plate 42. The fins 51 extend in parallel with one another from positions near the partition wall 47 toward the outlet 46. Coolant passages or microchannels 52 are defined between the adjacent fins 51 to extend from positions near the partition wall 47 toward the outlet 46. Specifically, the microchannels 52 are arranged in parallel with one another. The width of the microchannel 52 is set in a range between 50 µm and 500 µm, for example. The fins 51 may be made of a high heat conductive material such as aluminum, for example. The fins 51 may be integral to the bottom plate 42. The upper ends of the fins 51 need not be connected to the top plate 41 in some cases.

Figure 4:
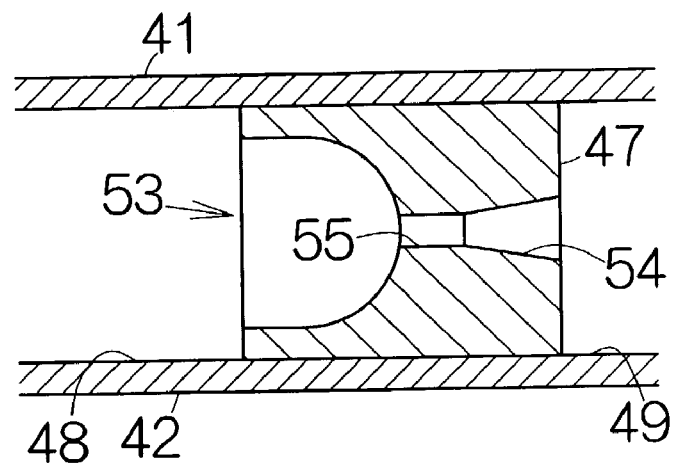
FIG. 4 is an enlarged vertical sectional view schematically illustrating the structure of a nozzle.
Figure 5:
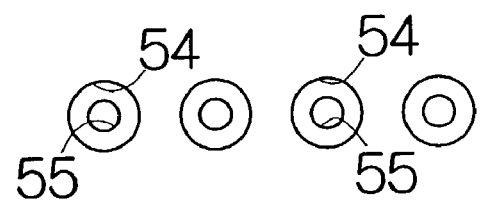
FIG. 5 is a front view schematically illustrating the shape of the nozzle according to a specific example.
Figure 6:
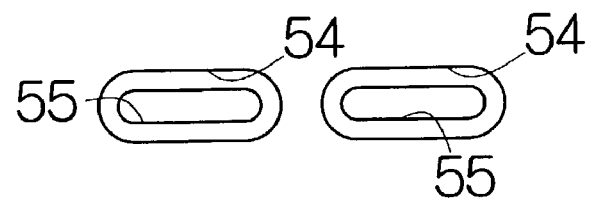
FIG. 6 is a front view schematically illustrating the shape of the nozzle according to another example.

Nozzles or atomizers 53 are embedded in the partition wall 47. As shown in FIG. 4, the nozzle 53 is designed to connect its outlet 54 to the inlet of the corresponding microchannel 52 in the evaporation chamber 49. A constriction 55 is defined in the nozzle 53 so as to remarkably reduce the sectional area of the passage. The constriction 55 serves to maintain the pressure of the liquid coolant within the introduction chamber 48 at a pressure higher than the atmospheric pressure. Such a pressure may range from 2 atm to 3 atm approximately, for example. The introduction chamber 48 thus functions as a high pressure chamber. Moreover, the nozzle 53 is allowed to discharge the atomized coolant from the outlet 54 into the evaporation chamber 49. The coolant discharged from the nozzle 53 includes droplets mixed with gas. The content of the gas may range from 10% to 20% by weight. The nozzle 53 thus serves to establish a mixed phase fluid including droplets and gas of the coolant in the evaporation chamber 49. As shown in FIG. 5, the nozzle 53 may have a circular cross-section so as to oppose the outlet 54 to the corresponding one of the microchannels 52. Alternatively, the nozzle 53 may be made of a wide slit so as to commonly oppose the outlet 54 to a group of the microchannels 52, as shown in FIG. 6. The diameter or height of the outlet may be set in a range between 0.2 mm and 0.5 mm approximately.

When the pump 31 operates, the liquid coolant is forced to circulate along the circulation channel 28. The liquid coolant discharged from the pump 31 is introduced into the introduction chambers 48 of the individual heat absorbing units 32. The discharge pressure of the pump 31 serves to keep the liquid coolant at a pressure higher than the atmospheric pressure in the introduction chamber 48. The liquid coolant is forced to flow out of the nozzle 53 into the evaporation chamber 49 irrespective of the reduced sectional area of the passage.

The droplets of the atomized coolant discharged from the nozzle 53 are guided along the microchannels 52 toward the outlet 46. A micro jet is uniformly established in the individual microchannels 52. The micro jet keeps generating a thin liquid film of a thickness ranging from 20 µm to 100 µm approximately over the wall surfaces of the microchannels 52, in other words, over the surfaces of the fins 51. Heat conducting from the CPU 33 to the bottom plate 42 promotes the evaporation of the coolant on the heat transfer surface of the bottom plate 42 and the surfaces of the fins 51. The coolant absorbs a large amount of heat from the bottom plate 42 and the fins 51 based on the evaporation. The latent heat is in this manner utilized to cool the CPU 33. The CPU 33 can thus efficiently be cooled as compared with the case where a heat transfer to the liquid coolant is simply utilized to cool the CPU 33. The CPU 33 is reliably prevented from an excessive rise in temperature. In addition, since the circulation channel 28 can be maintained at a relatively lower pressure as compared with a conventional refrigeration system, the piping structure of the circulation channel 28 can remarkably be facilitated as compared with that of a conventional refrigeration system.

The performance of the cooling system 27 can be adjusted based on the flow rate of the coolant supplied to the heat absorbing unit 32 and the amount of heat generated at the CPU 33. The performance is preferably set to maintain the content of the liquid coolant at approximately 10% by weight in the coolant discharged from the heat absorbing unit 32. The cooling system 27 of the invention is expected to realize a superior performance outraging that of a conventional cooling system even with a lower flow rate of the coolant. The volume of the pump 31 can thus be set smaller.

Figure 7:
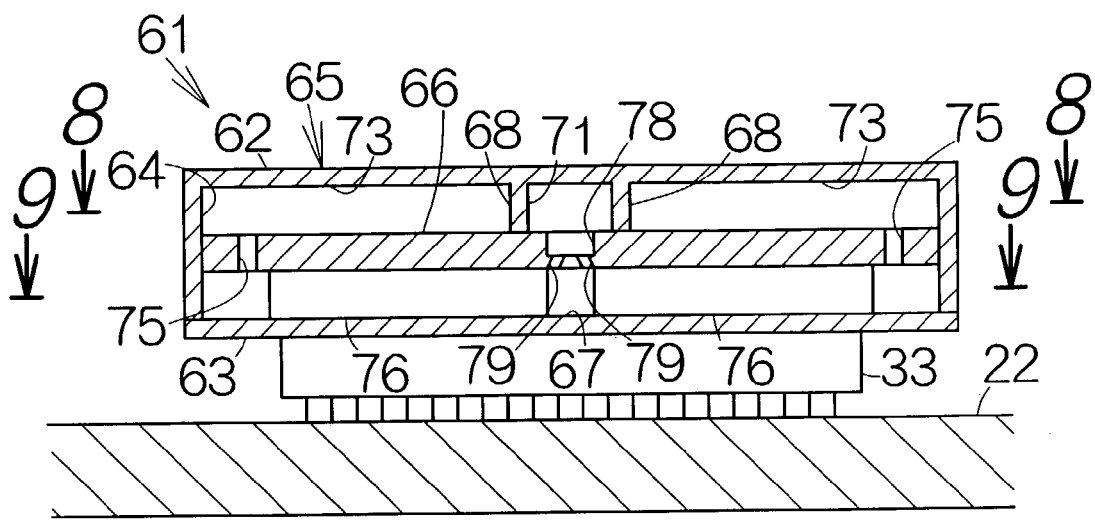
FIG. 7 is a vertical sectional view schematically illustrating the structure of a heat absorbing unit according to a second embodiment.

FIG. 7 illustrates a heat absorbing unit 61 according to a second embodiment in detail. The heat absorbing unit 61 includes a housing 65 defining a closed space 64 between a top plate 62 and a bottom plate 63 in the same manner as described above. The bottom plate 63 is allowed to contact a target heat generating object, namely, the CPU 33. A first partition wall or intermediate plate 66 is disposed in the housing 65 between the top and bottom plates 62, 63. The periphery of the intermediate plate 66 is connected to the inner wall surface of the housing 65. An evaporation chamber 67 is thus defined between the intermediate plate 66 and the bottom plate 63. A heat transfer surface of the evaporation chamber 67 is defined on the upper surface of the bottom plate 63 contacting the CPU 33 in the same manner as described above. The bottom plate 63 of the housing 65 may be made of a high heat conductive material such as aluminum, for example.

Figure 8:
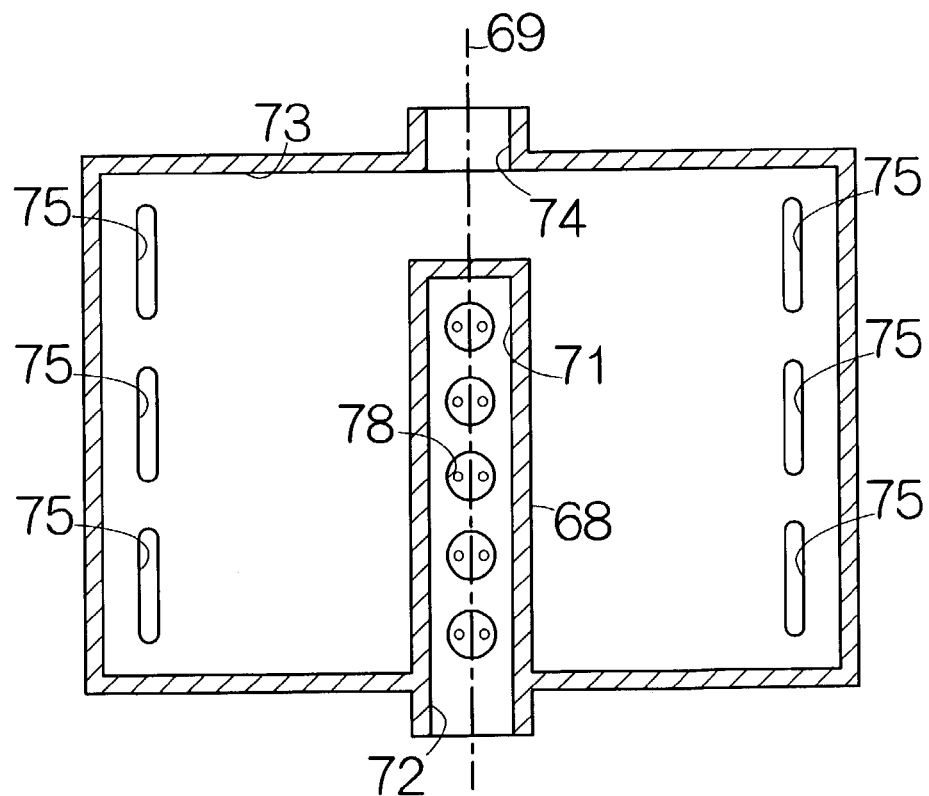
FIG. 8 is a sectional view taken along the line 8—8 in FIG. 7.

A second partition wall or surrounding wall 68 is disposed between the top plate 62 and the intermediate plate 66. The surrounding wall 68 stands from the upper surface of the intermediate plate 66 so as to contact the upper end with the lower surface of the top plate 62. As is apparent from FIG. 8, the surrounding wall 68 serves to define an introduction chamber 71 in cooperation with the top and intermediate plates 62, 66. The introduction chamber 71 is designed to extend along the centerline 69 of the intermediate plate 66. An inlet 72 opens at the introduction chamber 71. The inlet 72 is connected to the discharge port of the pump 31.

The surrounding wall 68 simultaneously defines a return chamber 73 between the top and intermediate plates 62, 66 adjacent the introduction chamber 71. An outlet 74 opens at the return chamber 73. The outlet 74 is connected to the aforementioned heat exchanger 34.

Passage ports 75 are defined in the intermediate plate 66 at remotest positions from the surrounding wall 68. The passage ports 75 serve to connect the lower evaporation chamber 67 to the upper return chamber 73. The gaseous coolant, as a result of the evaporation, as well as the liquid coolant in the evaporation chamber 67 is introduced into the return chamber 73 through the passage ports 75, as described later in detail.

Figure 9:
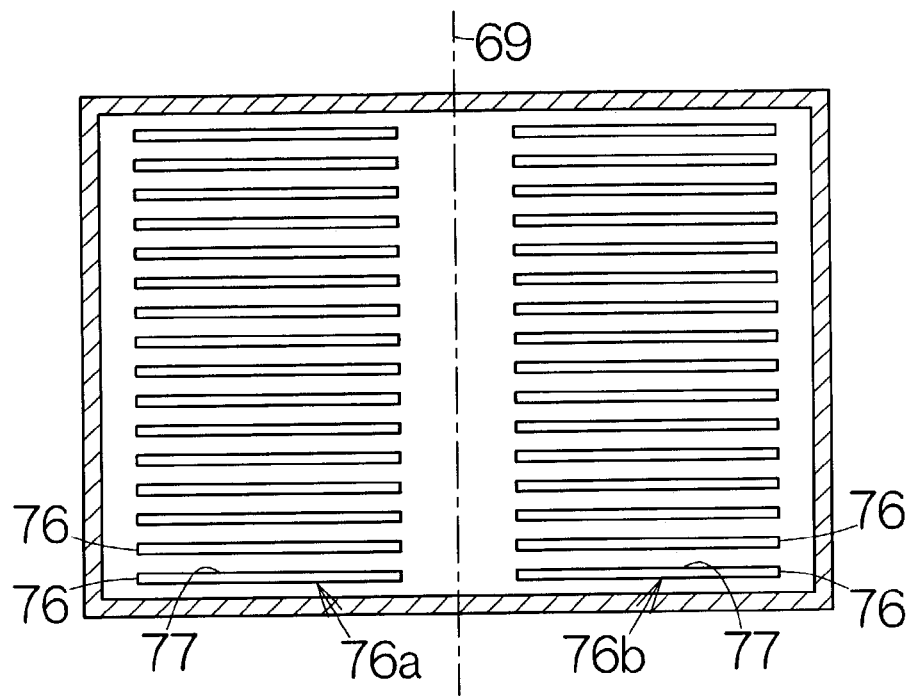
FIG. 9 is a sectional view taken along the line 9—9 in FIG. 7.

As is apparent from FIG. 9, fins 76 in first fin set 76a and second fin set 76b are disposed in the evaporation chamber 67. The fins 76 stand from the wall surface of the housing 65, in other words, from the upper surface of the bottom plate 63. The fins 76 extend in parallel with one another from positions near the centerline 69 of the intermediate plate 66 toward the passage ports 75. Coolant passages or microchannels 77 are defined between the adjacent fins 76 to likewise extend from positions near the centerline 69 toward the passage ports 75. Specifically, the microchannels 77 are arranged in parallel with one another. The width of the microchannel 77 may be set in a range between 50 μm and 500 μm, for example, in the aforementioned manner. The fins 77 may be made of a high heat conductive material such as aluminum, for example. The fins 77 may be integral to the bottom plate 63. The upper ends of the fins 77 need not be connected to the intermediate plate 66.

Referring again to FIGS. 7 and 8, nozzles or atomizers 78 are embedded in the intermediate plate 66. The nozzle 78 is designed to connect its outlet 79 to the inlet of the corresponding microchannel 77 in the evaporation chamber 67. The nozzles 78 serve to generate micro jets in the microchannels 77 as described above.

The heat absorbing unit 61 allows the droplets of the atomized coolant discharged from the nozzles 78 to flow along the microchannels 77 toward the outlet 74. As described above, the micro jet keeps generating a thin liquid film of a thickness ranging from 20 μm to 100 μm approximately over the wall surfaces of the microchannels 77, in other words, over the surfaces of the fins 76. Heat conducting from the CPU 33 to the bottom plate 63 promotes the evaporation of the coolant on the heat transfer surface of the bottom plate 63 and the surfaces of the fins 76. The coolant absorbs a large amount of heat from the bottom plate 63 and the fins 76 based on the evaporation. The CPU 33 can thus efficiently be cooled in the same manner as described above. The CPU 33 is reliably prevented from an excessive rise in temperature.

In addition, the microchannels 76 are allowed to extend from positions near the centerline 69 of the intermediate plate 66 toward the outer periphery in the heat absorbing unit 61. The length of the microchannels 76 can be set smaller as compared with the case where the microchannels seamlessly extend between the opposite outer peripheries. A uniform thin liquid film can reliably be realized over the surfaces of the fins 76 in the microchannels 77. This leads to an improved performance of cooling.

Figure 10:
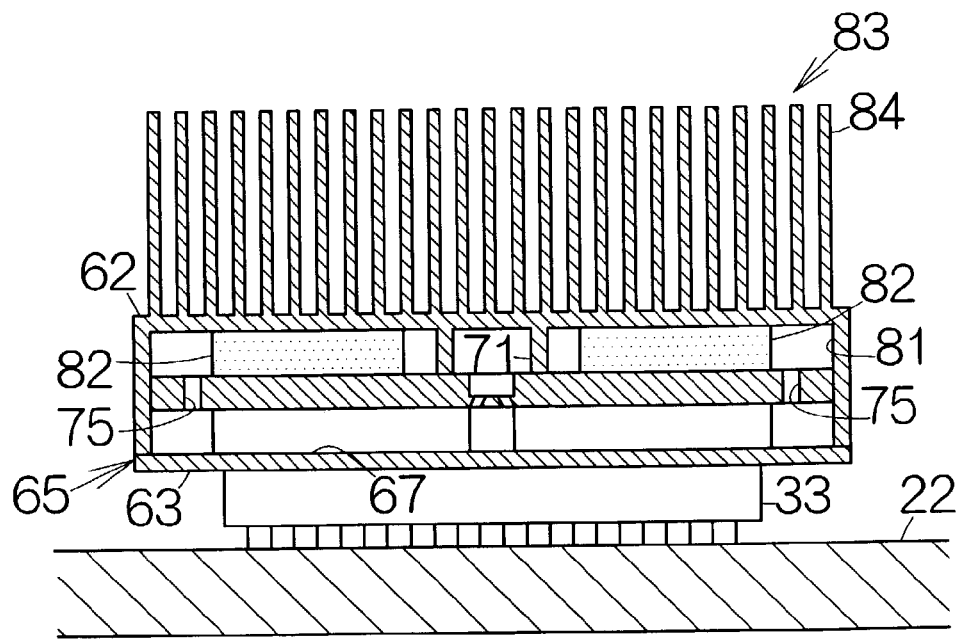
FIG. 10 is a vertical sectional view illustrating a modification of the heat absorbing unit according to the second embodiment.

As shown in FIG. 10, the aforementioned return chamber 73 may be utilized as a condensation chamber 81, for example. In this case, heat of the gaseous coolant is sufficiently radiated from the top plate 62 or else. Fins 82 may be disposed within the condensation chamber 81 so as to efficiently transfer heat to the top plate 62. The fins 82 may stand downward from the lower surface of the top plate 62 so as to contact the lower ends with the intermediate plate 66. The fins 82 may be made of a high heat conductive material such as aluminum, for example. The fins 82 may be integral to the housing 65. The fins 82 serve to establish an efficient transfer of heat from the gaseous coolant to the top plate 62. The condensation of the liquid coolant is thus expected to get promoted in the condensation chamber 81. The condensed coolant or liquid coolant is discharged out of the outlet 74. If the heat absorbing unit 61 is allowed to discharge the liquid coolant without any gas, the aforementioned heat exchanger 34 may be omitted from the circulation channel 28.

As is apparent from FIG. 10, a heat sink 83 may be formed on the outer surface of the top plate 62 adjacent the condensation chamber 81. The heat sink 83 may include air cooling fins 84 standing from the upper surface of the top plate 62. The heat sink 83 is expected to further promote the radiation of heat from the condensation chamber 81.

Figure 11:
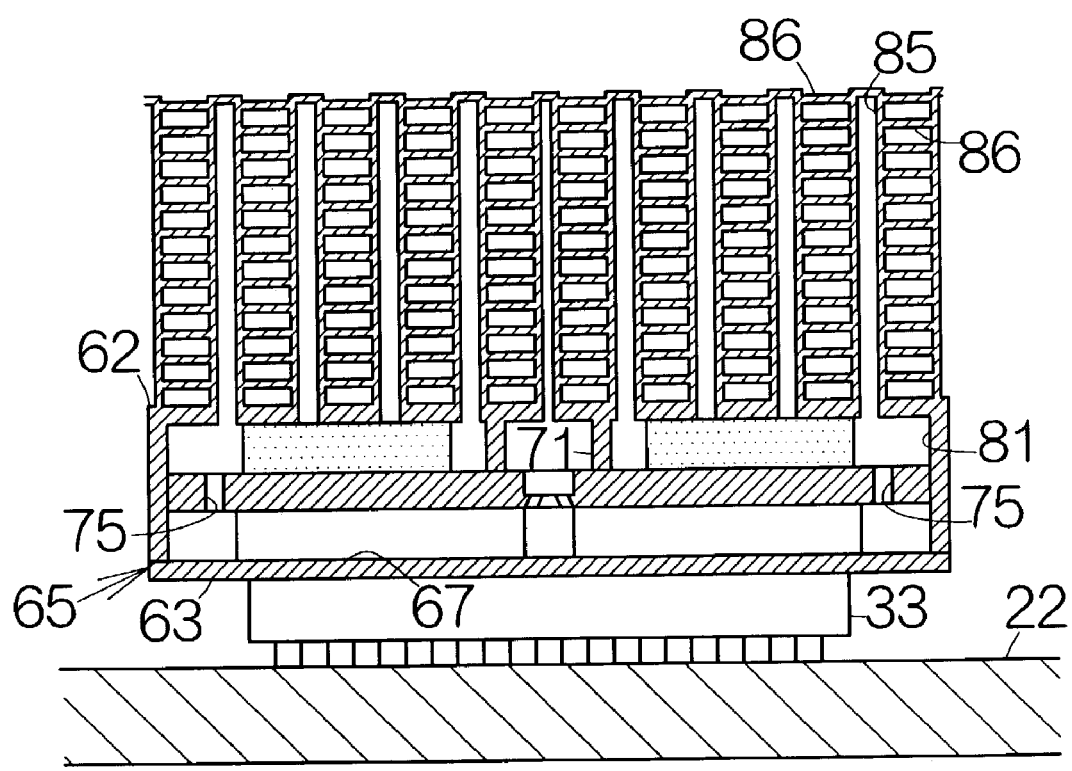
FIG. 11 is a vertical sectional view illustrating another modification of the heat absorbing unit according to the second embodiment.

Alternatively, a thermosiphon 85 maybe formed on the outer surface of the top plate 62 adjacent the condensation chamber 81 as shown in FIG. 11. The thermosiphon 85 may stand from the top plate 62. Air cooling fins 86 are formed on the outer surface of the thermosiphon 85. The gaseous coolant is introduced into the thermosiphon 85 from the condensation chamber 81. The gaseous coolant gets condensed in the thermosiphon 85. The thermosiphon 85 is expected to further promote the radiation of heat from the condensation chamber 81.

The cooling system 27 including the aforementioned heat absorbing unit 32, 61 can be employed to cool any type of high density devices generating heat, such as a large-scale integrated circuit (LSI) chip and a multi-chip module (MCM), in addition to the aforementioned LSI package. In addition, the cooling system 27 may be employed to cool any type of heat generating objects. The cooling system 27 may employ any type of coolant, only if the coolant can be kept in a liquid phase under a normal environment and allowed to get sufficiently vaporized in response to transfer of heat from a target heat generating object.

What is claimed is:

1. A cooling system comprising:
a circulation channel of a closed loop filled with a coolant;
a pump disposed in the circulation channel so as to force the coolant to circulate along the circulation channel;
an evaporation chamber defined within a housing disposed in the circulation channel downstream of the pump, the evaporation chamber allowing the coolant to get vaporized;
a fin standing on an inner wall surface of the housing within the evaporation chamber;
a nozzle connecting an outlet to the evaporation chamber; and
a condensation chamber defined within the housing, wherein
the coolant is discharged from the nozzle into the evaporation chamber so that a micro jet is established along the fin, and the condensation chamber is designed to receive the micro jet from the evaporation chamber and allows vaporized coolant of the micro jet to get condensed.

2. A cooling system comprising:
a circulation channel of a closed loop filled with a coolant;
a pump disposed in the circulation channel so as to force the coolant to circulate along the circulation channel;
a heat absorbing unit disposed in the circulation channel, said heat absorbing unit having an inlet connected to an outlet of the pump;
microchannels defined in a housing of the heat absorbing unit in parallel with one another, said microchannels having inlets connected to the inlet of the heat absorbing unit;
at least a nozzle connected to the inlets of the microchannels; and
a condensation chamber defined within the housing, the condensation chamber designed to receive the coolant discharged from the heat absorbing unit and allowing vaporized coolant of a received coolant to get condensed.

3. A heat absorbing unit comprising:
a housing;
high pressure chamber defined in the housing so as to receive a liquid coolant;
an evaporation chamber defined in the housing, the evaporation chamber allowing the liquid coolant to get vaporized;

a partition wall provided in the housing so as to separate the evaporation chamber from the high pressure chamber; and a nozzle embedded in the partition wall and connecting an outlet to the evaporation chamber.

4. The heat absorbing unit according to claim 3, wherein the nozzle is designed to directly discharge the coolant into microchannels defined in the evaporation chamber, and the microchannels extends in a same direction.

5. A heat absorbing unit comprising:

a housing defining a closed space between a top plate and a bottom plate, the bottom plate contacting a target object;

an intermediate plate disposed within the closed space between the top and bottom plates, the intermediate plate connected to an inner wall surface of the housing;

an evaporation chamber defined between the intermediate and bottom plates;

a fin standing from a wall surface of the housing within the evaporation chamber;

a nozzle connecting an outlet to the evaporation chamber; and a condensation chamber defined between the top and intermediate plates, the condensation chamber receiving the coolant from the evaporation chamber.

6. The heat absorbing unit according to claim 5, wherein an air cooling fin is attached to an outer surface of the top plate.

7. The heat absorbing unit according to claim 5, wherein a thermosiphon is attached to an outer surface of the top plate.

8. The heat absorbing unit according to claim 5, wherein the condensation chamber includes a passage port designed to receive the coolant from the evaporation chamber, the heat absorbing unit further comprises a fin standing from a wall surface of the housing within the evaporation chamber and extending from the outlet of the nozzle toward the passage port of the condensation chamber, and the nozzle is designed to discharge the coolant in a depression parallel to the fin.

9. A heat absorbing unit comprising:

a housing defining a closed space between a top plate and a bottom plate, the bottom plate contacting a target object;

an intermediate plate disposed within the closed space between the top and bottom plates, the intermediate plate connected to an inner wall surface of the housing;

coolant passages defined in a space between the intermediate and bottom plates, the coolant passages extending in parallel with one another;

a nozzle connecting an outlet to an inlet of a corresponding one of the coolant passage; and a condensation chamber defined between the top and intermediate plates, the condensation chamber receiving the coolant from the coolant passages.

10. The heat absorbing unit according to claim 9, wherein an air cooling fin is attached to an outer surface of the top plate.

11. The heat absorbing unit according to claim 9, wherein a thermosiphon is attached to an outer surface of the top plate.

12. The heat absorbing unit according to claim 5, wherein the nozzle is designed to directly discharge the coolant into the coolant passages.

13. A cooling system comprising:

a circulation channel of a closed loop filled with a coolant;

a pump disposed in the circulation channel so as to force the coolant to circulate along the circulation channel;

an evaporation chamber defined within a housing disposed in the circulation channel downstream of the pump, the evaporation chamber allowing the coolant to get vaporized;

a nozzle connecting an outlet to the evaporation chamber; and a fin standing on an inner wall surface of the housing within the evaporation chamber, the fin extending from the outlet of the nozzle toward an outlet of the evaporation chamber, wherein the nozzle is designed to discharge the coolant in a depression parallel to the fin within the evaporation chamber so that a micro jet is established along the fin.

14. The cooling system according to claim 13, wherein an atmospheric pressure is maintained upstream of the pump.

15. The cooling system according to claim 13, wherein the coolant discharged from the nozzle is a mixed phase fluid including droplets and gas of the coolant.

16. The cooling system according to claim 13, wherein the micro jet keeps a thin liquid film of the coolant over a surface of the fin.

17. The cooling system according to claim 15, a content of the gas ranges from 10% to 20% by weight.

18. A cooling system comprising:

a circulation channel of a closed loop filled with a coolant;

a pump disposed in the circulation channel so as to force the coolant to circulate along the circulation channel;

a heat absorbing unit disposed in the circulation channel, said heat absorbing unit having an inlet connected to an outlet of the pump;

microchannels defined in a housing of the heat absorbing unit in parallel with one another, said microchannels having inlets connected to the inlet of the heat absorbing unit; and at least a nozzle connected to the inlets of the microchannels and designed to directly discharge the coolant into the microchannels.

19. The cooling system according to claim 18, wherein an atmospheric pressure is maintained upstream of the pump.

20. The cooling system according to claim 18, wherein the coolant discharged from the at least a nozzle is a mixed phase fluid including droplets and gas of the coolant.

21. A heat absorbing unit comprising:

a housing;

an evaporation chamber defined in the housing;

a fin standing on an inner wall surface of the housing within the evaporation chamber; and a nozzle connecting an outlet to the evaporation chamber and designed to discharge a coolant from the outlet in a depression parallel to the fin so that a micro jet is established along the fin, wherein the fin extends from the outlet of the nozzle toward an outlet of the evaporation chamber.

22. A heat absorbing unit comprising:

a housing;

microchannels defined in the housing in parallel with one another, said microchannels having inlets connected to an inlet of the housing; and at least a nozzle connected to the inlets of the microchannels and designed to directly discharge a coolant into the microchannels.

* * * * *